(12) United States Patent
Shi et al.

(10) Patent No.: US 10,910,276 B1
(45) Date of Patent: Feb. 2, 2021

(54) STI STRUCTURE WITH LINER ALONG LOWER PORTION OF LONGITUDINAL SIDES OF ACTIVE REGION, AND RELATED FET AND METHOD

(71) Applicant: GLOBALFOUNDRIES INC., Grand Cayman (KY)

(72) Inventors: Yongjun Shi, Clifton Park, NY (US); Xinyuan Dou, Clifton Park, NY (US); Chun Yu Wong, Clifton Park, NY (US); Hongliang Shen, Ballston Lake, NY (US); Baofu Zhu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/589,789

(22) Filed: Oct. 1, 2019

(51) Int. Cl.
| | |
|---|---|
| *H01L 21/8238* | (2006.01) |
| *H01L 29/66* | (2006.01) |
| *H01L 21/762* | (2006.01) |
| *H01L 27/092* | (2006.01) |
| *H01L 29/78* | (2006.01) |

(52) U.S. Cl.
CPC ......... *H01L 21/823878* (2013.01); *H01L 21/76224* (2013.01); *H01L 27/0924* (2013.01); *H01L 29/66795* (2013.01); *H01L 29/785* (2013.01)

(58) Field of Classification Search
CPC ....... H01L 21/76224; H01L 21/823878; H01L 27/0924; H01L 29/66795; H01L 29/785
See application file for complete search history.

(56) References Cited

U.S. PATENT DOCUMENTS

| 6,368,931 | B1 | 4/2002 | Kuhn et al. | |
|---|---|---|---|---|
| 7,198,995 | B2 | 4/2007 | Chidambarrao et al. | |
| 7,602,021 | B2 | 10/2009 | Doris et al. | |
| 2002/0003275 | A1* | 1/2002 | Lee | H01L 21/76224 257/510 |
| 2005/0282351 | A1* | 12/2005 | Quevedo-Lopez | H01L 29/7842 438/424 |
| 2006/0220142 | A1* | 10/2006 | Tamura | H01L 21/823807 257/374 |
| 2006/0281245 | A1* | 12/2006 | Okuno | H01L 21/823878 438/221 |
| 2011/0097889 | A1 | 4/2011 | Yuan et al. | |
| 2017/0018453 | A1* | 1/2017 | Park | H01L 27/10897 |

* cited by examiner

*Primary Examiner* — Allan R Wilson
(74) *Attorney, Agent, or Firm* — Francois Pagette; Hoffman Warnick LLC

(57) ABSTRACT

A structure, an STI structure and a related method are disclosed. The structure may include an active region extending from a substrate; a gate extending over the active region; and a source/drain region in the active region, and an STI structure. The STI structure includes a liner and a fill layer on the liner along the opposed longitudinal sides of a lower portion of the active region, and the fill layer along the opposed ends of the active region. The liner may include a tensile stress-inducing liner that imparts a transverse-to-length tensile stress in at least a lower portion of the active region but not lengthwise. The liner can be applied in an n-FET region and/or a p-FET region to improve performance.

20 Claims, 7 Drawing Sheets

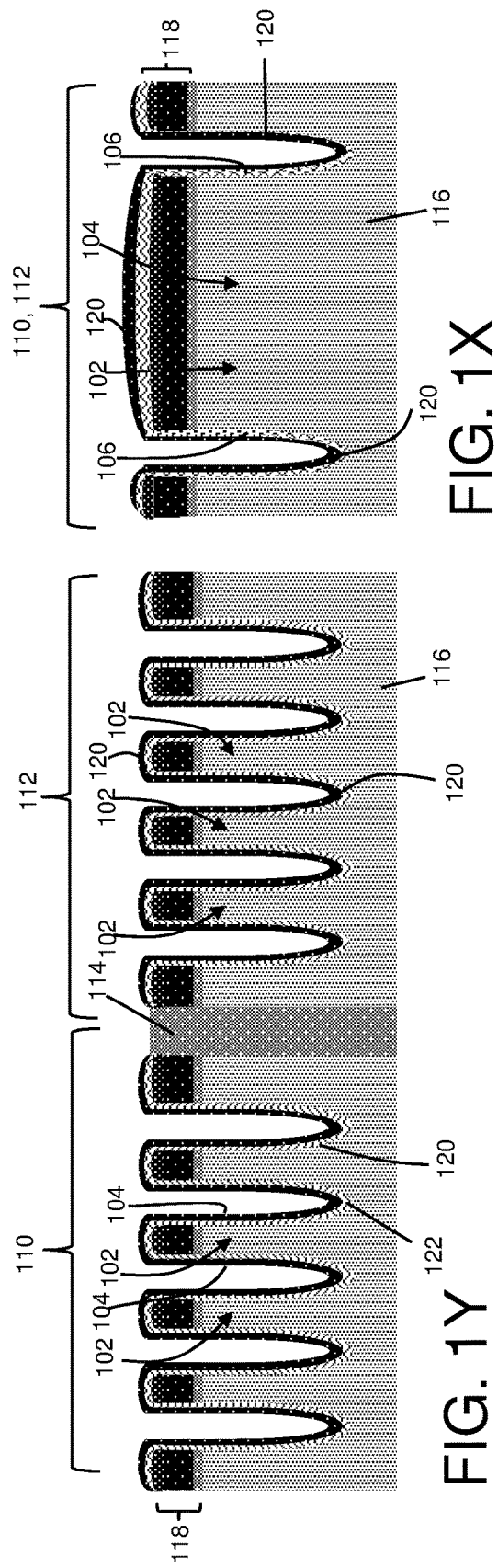
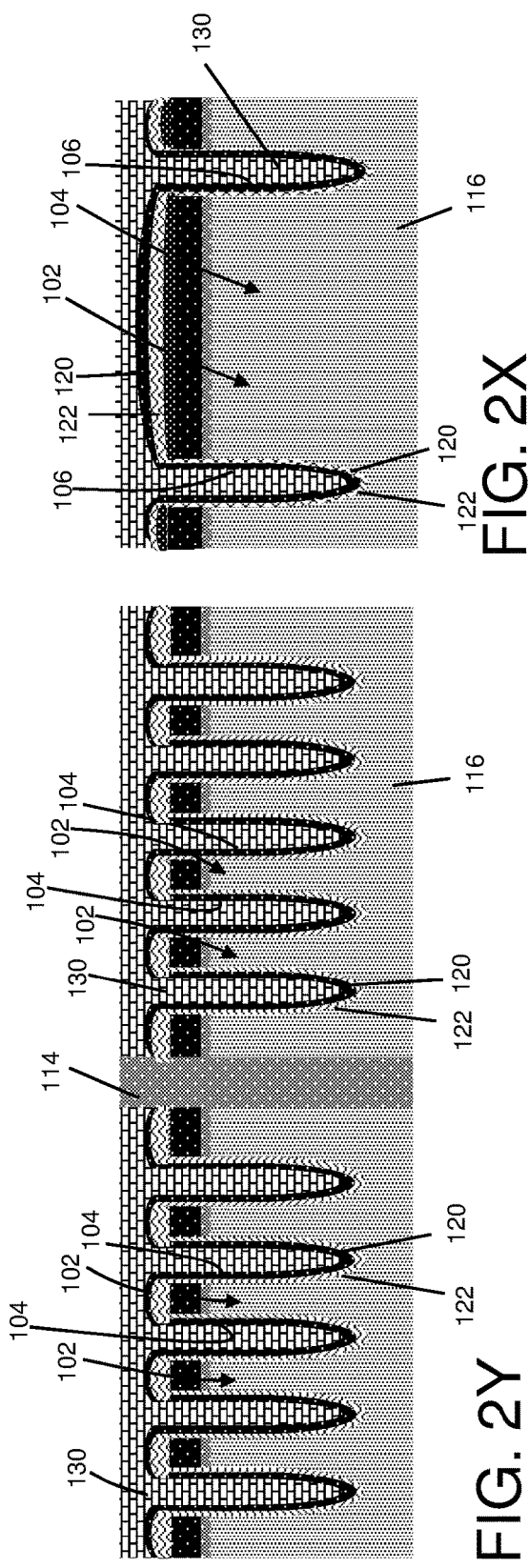
FIG. 1X
FIG. 1Y
FIG. 2X
FIG. 2Y

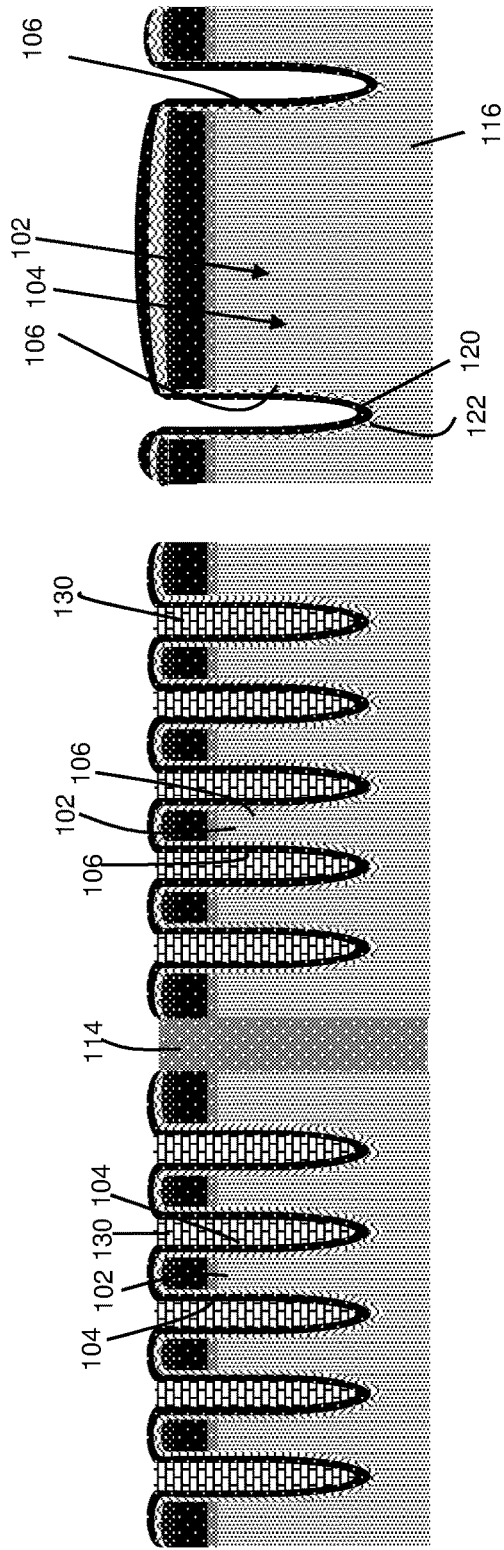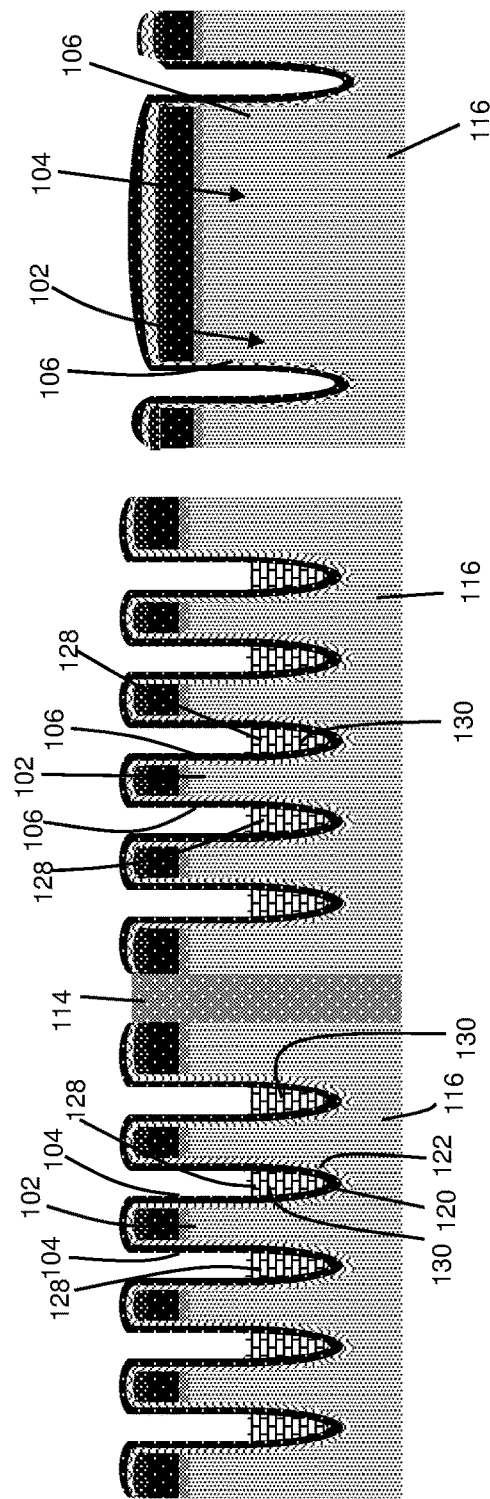

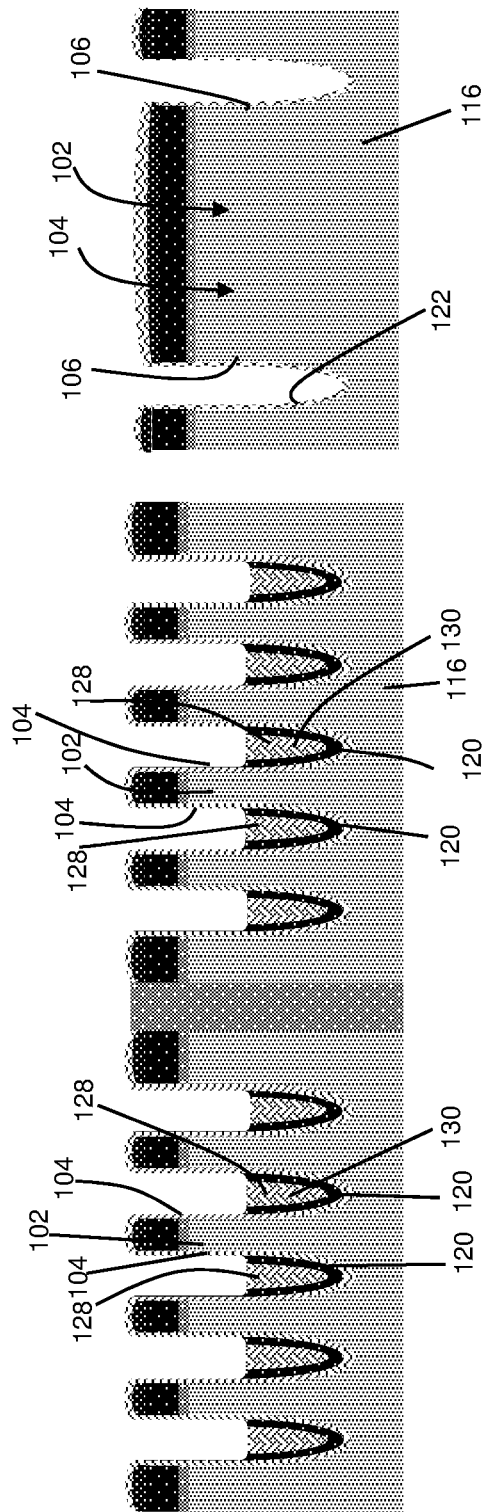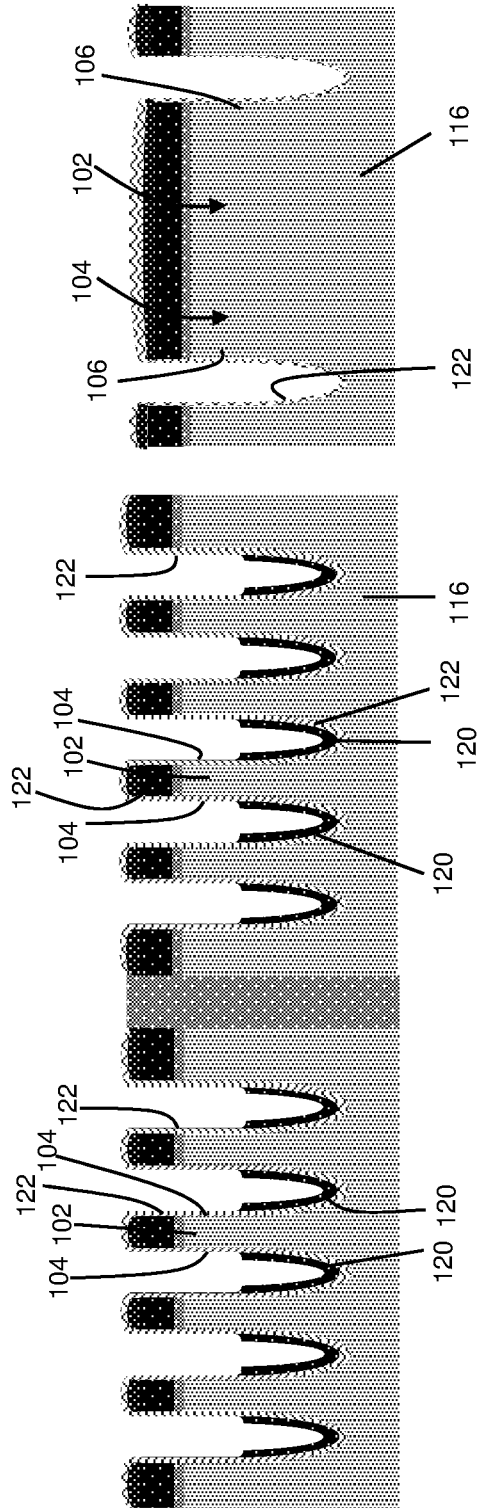

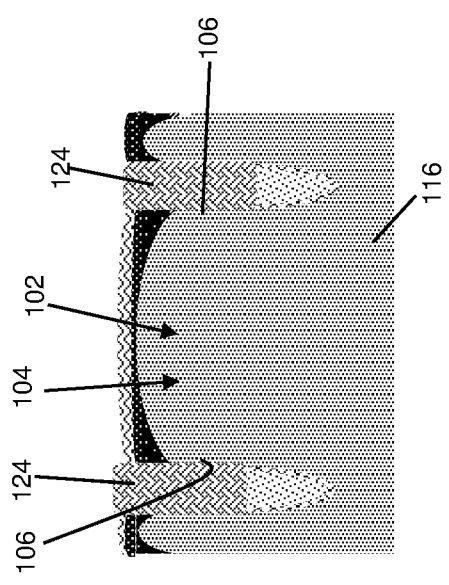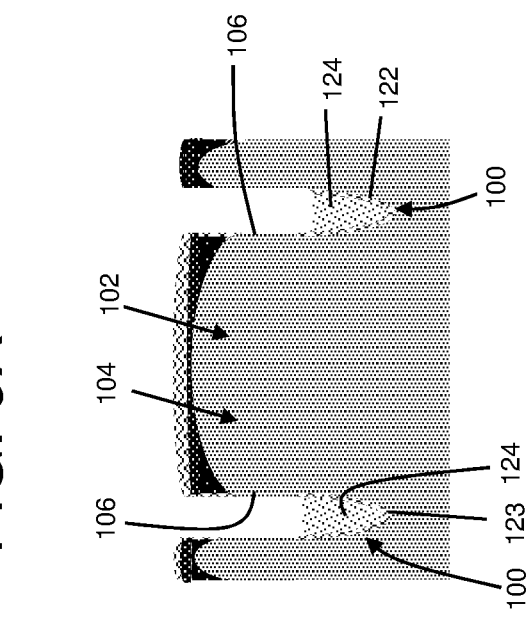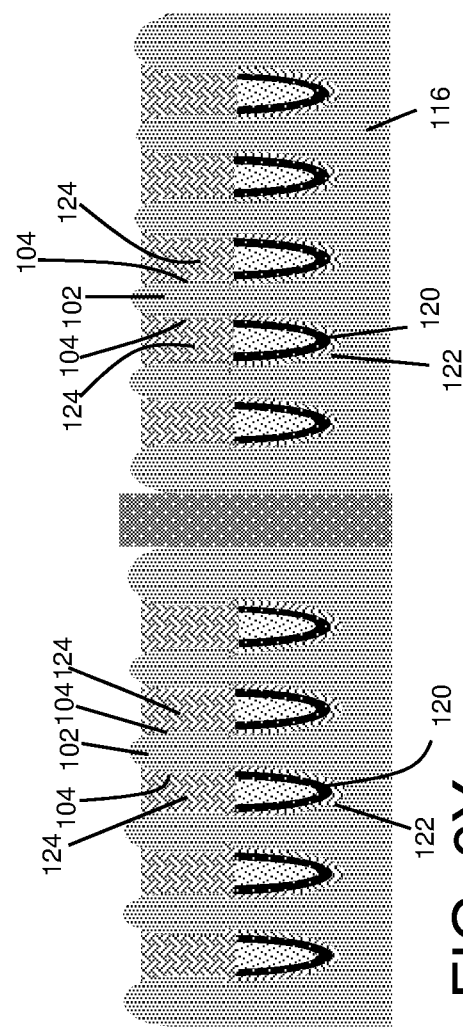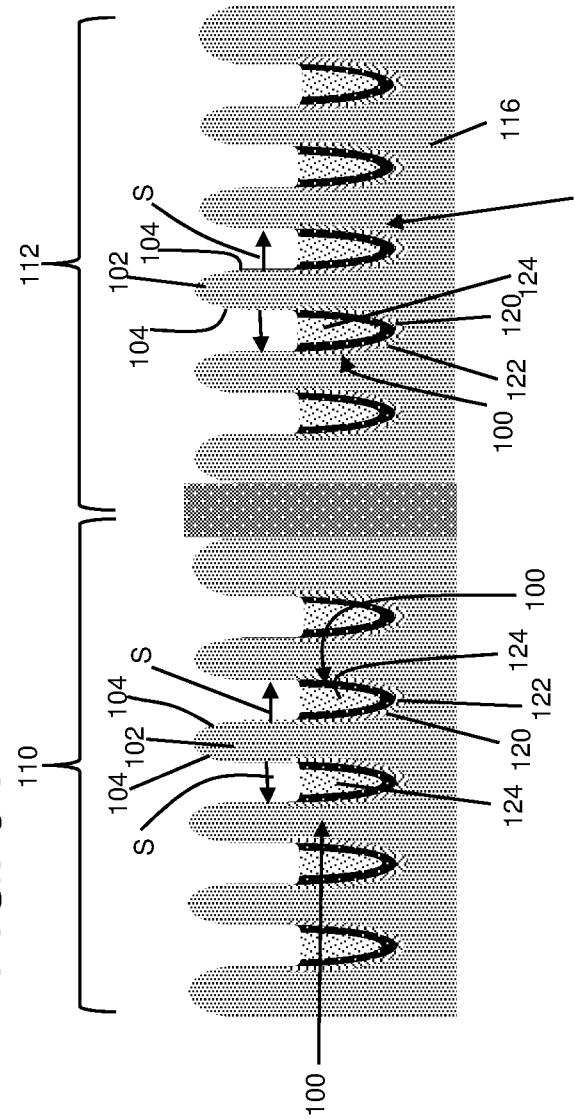
FIG. 9X
FIG. 10X
FIG. 9Y
FIG. 10Y

STI STRUCTURE WITH LINER ALONG LOWER PORTION OF LONGITUDINAL SIDES OF ACTIVE REGION, AND RELATED FET AND METHOD

BACKGROUND

The present disclosure relates to integrated circuit (IC) fabrication, and more specifically, to a shallow trench isolation (STI) structure including a liner along a lower portion of longitudinal sides of an active region, and a related structure and method.

Advanced manufacturing of ICs requires formation of individual circuit elements, e.g., field-effect-transistors (FETs) and the like, based on specific circuit designs. A FET generally includes source, drain, and gate regions. Fin-type field effect transistor (finFETs) are formed by creating a number of semiconductor fins on a substrate and placing a gate conductor perpendicularly across the fins. A finFET is created by the gate forming a channel region below the gate in the fin, and source/drain regions formed in the fin aside the gate. To improve performance of finFETs, parts of the fin are typically stressed. However, advanced technology nodes, e.g., 14 nanometer and beyond, are forming fins with smaller dimensions, different materials and with different formation techniques. The different materials and formation techniques create less tensile stress in the semiconductor fins, which degrades performance. For example, changes in flowable chemical vapor deposition (FCVD) processes reduces the stress in semiconductor fins.

SUMMARY

A first aspect of the disclosure is directed to a structure, comprising: a transistor including: an active region over a substrate, the active region having a rectangular cross-sectional shape including opposed longitudinal sides and shorter opposed ends; a gate extending over the active region; a source/drain region in the active region; and a shallow trench isolation (STI) structure around a lower portion of the active region, the STI structure including: a first liner and a fill layer on the first liner along the opposed longitudinal sides of the active region, and the fill layer along the opposed ends of the active region.

A second aspect of the disclosure includes a shallow trench isolation (STI) structure for an active region, the active region having a rectangular cross-sectional shape including opposed longitudinal sides and shorter opposed ends, the STI structure comprising: a first liner and a fill layer on the first liner along the opposed longitudinal sides of a lower portion of the active region, and the fill layer along the opposed ends of the active region.

A third aspect of the disclosure related to a method, comprising: providing an active region extending from a substrate, the active region having a rectangular horizontal cross-sectional shape including opposed longitudinal sides and shorter opposed ends; and forming a shallow trench isolation (STI) structure around a lower portion of the active region, the STI structure including: a first liner and a fill layer on the first liner along the opposed longitudinal sides of the active region, and the fill layer along the opposed ends of the active region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1Y and 1X show cross-sectional views of forming a liner over an active region according to embodiments of the disclosure.

FIGS. 2Y and 2X show cross-sectional views of forming a sacrificial layer over the active region according to embodiments of the disclosure.

FIGS. 5Y and 5X show cross-sectional views of removing the mask and recessing the sacrificial layer according to embodiments of the disclosure.

FIGS. 6Y and 6X show cross-sectional views of further recessing the sacrificial layer to form an etch stop member according to embodiments of the disclosure.

FIGS. 7Y and 7X show cross-sectional views of removing the liner over an upper portion of the longitudinal sides and the opposed ends of the active region using the etch stop member according to embodiments of the disclosure.

FIGS. 8Y and 8X show cross-sectional views of removing the etch stop member according to embodiments of the disclosure.

FIGS. 9Y and 9X show cross-sectional views of forming a fill layer over the active region according to embodiments of the disclosure.

FIGS. 10Y and 10X show cross-sectional views of recessing the fill layer to form an STI structure according to embodiments of the disclosure.

Figure 3X:
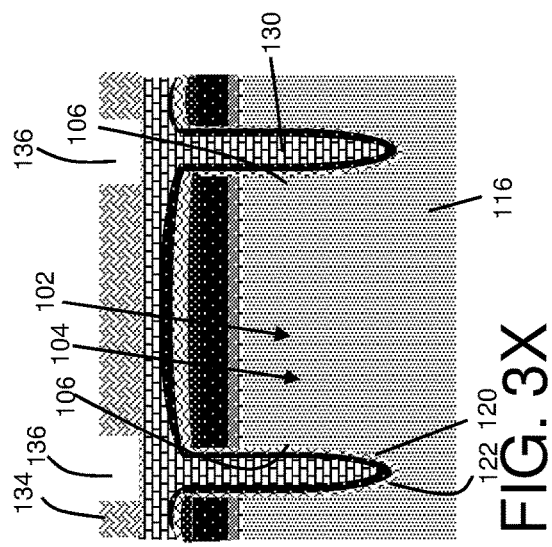
FIGS. 3Y and 3X show cross-sectional views of forming a mask exposing opposed ends of the active region according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a shallow trench isolation (STI) structure applicable to field effect transistors (FETs)(e.g., a finFET). The STI structure has a liner along a lower portion of opposed longitudinal sides of an active region, but not over opposed ends of the active region. The liner may include a stress-inducing liner that imparts a transverse-to-length tensile stress in at least the lower portion of each selected active region—but not lengthwise. The stress is advantageous to the performance of both n-FETs and p-FETs. A FET including the STI structure, and a related method of forming the STI structure are also disclosed.

Referring to FIGS. 1Y to 10X, a method of forming an STI structure 100 (FIGS. 10Y, 10X) will be described. STI structure 100 includes an active region 102 having a rectangular cross-sectional shape, i.e., looking top down, including opposed longitudinal sides 104 (FIG. 10Y, one shown in FIG. 10X) and shorter opposed ends 106 (FIG. 10X). Although it can be applied to other forms of active regions, STI structure 100 (FIGS. 10Y, 10X) will be described as applied to active region 102 in the form of a semiconductor fin. As recognized in the art, semiconductor fins have a rectangular cross-sectional shape, i.e., looking top down, including opposed longitudinal sides 104 (FIG. 10Y, one shown in FIG. 10X) and shorter opposed ends 106 (FIG. 10X). Other forms of active regions may include but are not limited to: rectangularly shaped bulk silicon, nanosheets, and nanowires. The figures include X and Y labels denoting whether they show a cross-section of the processing in the Y-direction that extends across the shorter widths of active region 102, and the X-direction that extends along the longer length of the active region. The opposed longitudinal sides 104 extend into and out of the page in the Y figures and side-to-side in the X figures, and opposed ends 106 extend into and out of the page in the X figures. The corresponding X and Y cross-sections of each figure number show the same processing. Those figures labeled with a Y that show the cross-section in the Y direction also show an n-type field effect transistor (e.g., an n-finFET) region 110 and a p-type field effect transistor (e.g., a p-finFET) region 112; and those figures labeled with an X that show the cross-section in the X direction show both regions 110, 112. As shown in the Y figures, n-FET region 110 and p-FET region 112 are electrically isolated from one another, e.g., by a trench isolation 114.

STI structure 100 is formed around a lower portion of active region 102. As will be described, and as shown in FIGS. 10Y and 10X, STI structure 100 includes a liner 120 and a fill layer 124 on liner 120 along lower portions of opposed longitudinal sides 104 of semiconductor fin, and fill layer 124 along opposed ends 106 of active region 102.

FIGS. 1Y and 1X show cross-sectional views of providing active region 102, e.g., a semiconductor fin, extending from a substrate 116. The disclosure will be described relative to a single active region having any number of adjacent active regions 102, e.g., fins. It is recognized that the teachings of the disclosure may be applied to any one or more active regions 102. In addition, providing active region 102 includes providing the active region in each of n-FET region 110 and/or p-FET region 112 (both shown). As noted, n-FET region 110 and p-FET region 112 are electrically isolated from one another, e.g., by trench isolation 114. As noted, each active region has a rectangular horizontal cross-sectional shape including opposed longitudinal sides 104 that form the longer side of the active region, and shorter opposed ends 106 that form the shorter ends of the active region.

Active region 102 and substrate 116 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Active region(s) 102 may be formed using any now known or later developed semiconductor fabrication technique appropriate therefor, e.g., etching them from the substrate, deposition, etc. Active regions 102 may include a cap 118, e.g., of oxide and nitride.

FIGS. 1Y-8X show forming liner 120 around a lower portion of opposed longitudinal sides 104 of active region 102 with opposed ends 106 of the active region being devoid of liner 120. As will be described, FIGS. 9Y to 10X show forming fill layer 124 adjacent active region 102 to complete STI structure 100 (FIG. 10Y).

FIGS. 1Y-X also show depositing liner 120 about active region 102. At this point, liner 120 extends about opposed ends 106 and opposed longitudinal sides 104 of active region 102. In embodiments, liner 120 may include any variety of liner material, e.g., silicon nitride, oxide, etc. In other embodiments, liner 120 may include any now known or later developed stress-inducing material. In one non-limiting example, liner 120 includes a stress-inducing silicon nitride. In certain embodiments, liner 120 includes a tensile stress-inducing liner that imparts a transverse-to-length tensile stress (arrows S in FIG. 10Y) in at least the lower portion of active region 102.

Liner 120 may be formed using any appropriate deposition technique appropriate for the material. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, flowable chemical vapor deposition (FCVD), physical vapor deposition (PVD), atomic layer deposition (ALD), chemical oxidation, molecular beam epitaxy (MBE), plating, evaporation. In one non-limiting example, liner 120 may be formed using ALD. Liner 120 may have a thickness between 2-5 nanometers.

Where necessary or desired, prior to forming liner 120, a protective liner 122 may be optionally formed over active region 102. Protective liner 122 may include, for example, polysilicon. Protective liner 122 may be formed using any appropriate technique for the material being used. For example, polysilicon may be deposited using ALD. Protective liner 122 may have a thickness between 20-30 nanometers. While protective liner 122 is shown in subsequent drawings, it is recognized that it can be omitted.

FIGS. 2Y-6X show cross-sectional views of forming an etch stop member 128 (FIG. 6Y) along the lower portion of opposed longitudinal sides 104 of active region 102. FIGS. 2Y and 2X show cross-sectional views of forming a sacrificial layer 130 over liner 120. Sacrificial layer 130 may include any now known or later developed sacrificial material. In one non-limiting example, sacrificial layer 130 may include an organic dielectric layer (ODL) and/or a spin-on hard mask (SOH). A "organic dielectric layer" generally refers to any dielectric material that is organic, and thus may be more readily deposited in a space between active regions 102, and more readily removed therefrom, e.g., any low dielectric constant material (E=4 or less) which are easily etch in oxygen environments. These organic dielectrics typically can withstand temperatures in excess of 300° C. without degradation. The SOH may include any ancillary material to form micro-patterns in the semiconductor. SOH is not formed by evaporation, but by spin coating, which increases the accuracy of the micro-patterns.

Figure 3Y:
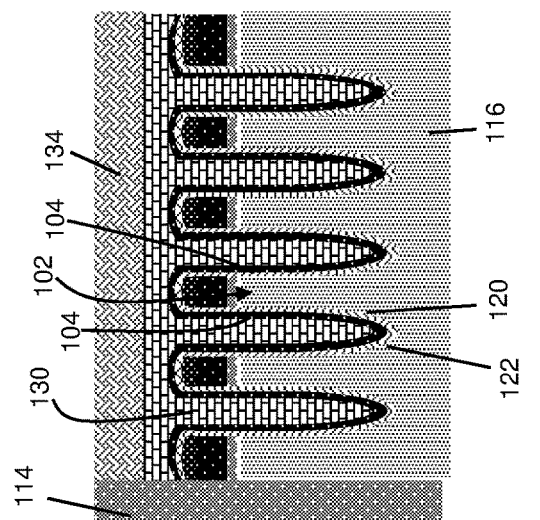

FIGS. 3Y and 3X show cross-sectional views of patterning a mask 134 that exposes the opposed ends 106 of active region 102, e.g., via openings 136 (FIG. 3X) therein. Mask 134 may include layer(s) of material which is/are applied over an underlying layer of material, and patterned to have openings 136, so that the underlying layer can be processed where there are openings. After processing the underlying layer, the mask may be removed. Common masking materials are photoresist (resist) and nitride. Nitride is usually considered to be a "hard mask." Mask 134 may include, for example, a developable organic planarization layer (OPL) on the layer to be etched, a developable anti-reflective coating (ARC) layer on the developable OPL, and a photoresist mask layer on the developable ARC layer.

Figure 4X:
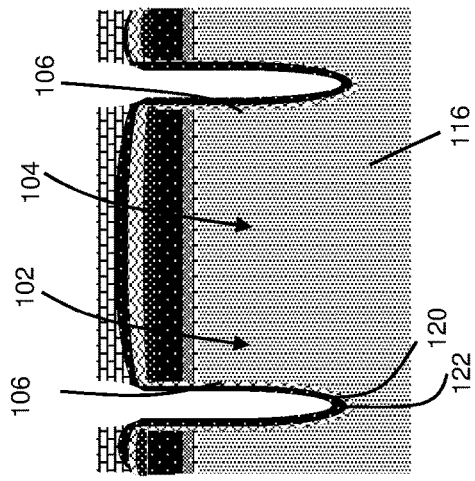
FIGS. 4Y and 4X show cross-sectional views of removing the sacrificial layer over the opposed ends of the active region using a mask according to embodiments of the disclosure.
Figure 4Y:
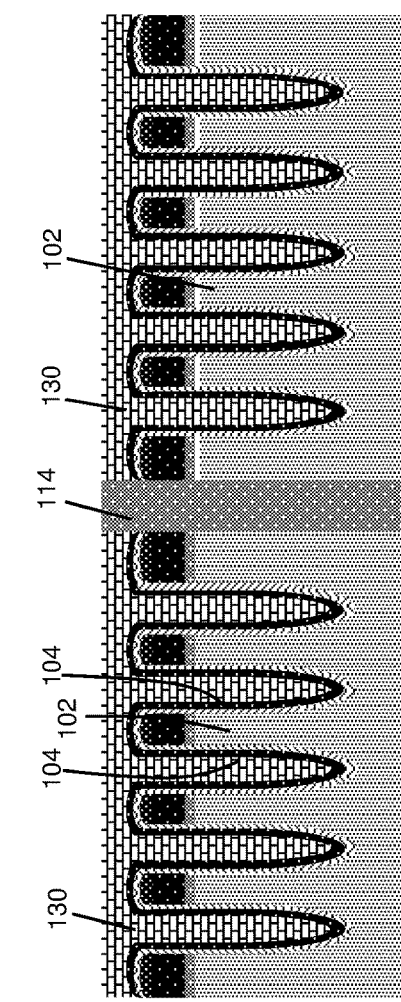

FIGS. 4Y and 4X show cross-sectional views of etching to remove sacrificial layer 130 from opposed ends 106 of active region 102. Note, only FIG. 4X actually shows removal of sacrificial layer 130 from opposed ends 106 of active region 102. The removal may include performing any etching process appropriate for sacrificial layer 130. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In one non-limiting example, sacrificial layer 130 may be removed using a RIE. Mask 134 directs the etching to remove sacrificial layer 130 from opposed ends 106 of active region 102. FIGS. 4Y and 4X also show removing any portion of mask 134 remaining after the etching, e.g., by an ashing process.

FIGS. 5Y, 5X, 6Y and 6X show cross-sectional views of recessing sacrificial layer 130. The intent of recessing of sacrificial layer 130 is to leave sacrificial layer 130 covering the lower portion of active region 102 to create an etch stop member 128 (FIG. 6Y). During the recessing, liner 120 protects opposed ends 106, and there is no change (see FIGS. 5X and 6X) at that location. In embodiments, the results of which are shown in FIG. 6Y, the recessing may include a single recessing step, e.g., an etching step. In other embodiments, the recessing may include two steps. In this latter case, as shown in FIG. 5Y, a first etching may be performed to remove sacrificial layer 130 from over active region 102, i.e., over the tops of a semiconductor fin, rectangular bulk silicon, a lower one or two nanosheets of a nanosheet stack or nanowire. FIG. 6Y shows a second etching to remove sacrificial layer 130 from over the upper portion of opposed longitudinal sides 104 of the active region, creating etch stop member 128. As illustrated, etch stop member 128 is adjacent the lower portion of longitudinal sides 104 of active region 102. Each etching may include, for example, a RIE. The second etching can be controlled to attain any desired height for etch stop member 128. As will be apparent, the height of etch stop member 128 determines the line between the upper and lower portions of the active region and how much of the lower portion of the active region ultimately includes liner 120 thereon.

FIGS. 7Y and 7X show cross-sectional views of removing liner 120 from opposed ends 106 of active region 102 (FIG. 7X) and from an upper portion of opposed longitudinal sides 104 of active region 102 (FIG. 7Y). The removal may include any etching process appropriate for liner 120 such as but not limited to a hot phosphorous etching chemistry. Protective liner 122, where provided, remains over upper portion of longitudinal sides 104 and opposed ends 106 of active region 102, e.g., rectangular bulk silicon or semiconductor fin. As illustrated in FIG. 7Y, etch stop member 128 is used to prevent removal of liner 120 from the lower portion of the opposed longitudinal sides 104. As a result, liner 120 remains along lower portions of opposed longitudinal sides 104, but is removed from an upper portion thereof. In addition, liner 120 is removed from opposed ends 106 (FIG. 7X), preventing liner 120 that induces a stress from imparting a stress to active region 102 lengthwise therealong. Consequently, where liner 120 imparts a stress, it can impart stress to just the lower portion of opposed longitudinal sides 104 of active region 102. For example, a liner 120 may include a tensile stress-inducing liner that imparts a transverse-to-length tensile stress (arrows S in FIG. 10Y) in at least the lower portion of active region 102, i.e., some stress may extend into the upper portion. The tensile stress transverse to active region 102, e.g., semiconductor fin or nanosheet, length is advantageous to the performance of both n-FETs and p-FETs. In contrast, since the liner that imparts a stress is removed from opposed ends 106 of active region 102, no stress is imparted lengthwise therealong. This is advantageous because the tensile stress lengthwise along an active region 102 can negatively impact the performance of p-FETs.

FIGS. 8Y and 8X show cross-sectional views of removing etch stop member 128. With regard to FIG. 8X, since etch stop member 128 is not present at that location, there is no change shown at that location. Etch stop member 128 may be removed using any appropriate etching for sacrificial layer 130 (FIG. 7Y), e.g., a RIE. Liner 120 remains along the lower portion of opposed longitudinal sides 104 of active region 102 after etch stop member 128 removal. Where provided, protective liner 122 also remains over active region 102.

FIGS. 9Y, 9X, 10Y and 10X show cross-sectional views of forming fill layer 124 adjacent active region 102. FIGS. 9Y and 9X show cross-sectional views of depositing fill layer 124. As shown in FIG. 9Y, fill layer 124 covers liner 120, i.e., along lower portion of opposed longitudinal sides 104, where it is provided. Otherwise, fill layer 124 abuts active region 102, or as shown, covers protective liner 122, where it is provided, e.g., on the upper portion of longitudinal sides 104 and opposed ends 106 of active region 102 (FIG. 9X). Fill layer 124 may include any dielectric used for trench isolations including but not limited to an oxide, like silicon oxide. Fill layer 124 may be deposited using any appropriate deposition technique such as flowable chemical vapor deposition (FCVD). Fill layer 124 may be planarized, where necessary, to remove excess material.

FIGS. 10Y and 10X show cross-sectional views of recessing fill layer 124 to complete STI structure 100. The recessing may include any appropriate etching process for the material used, e.g., a RIE for silicon oxide. As finalized, fill layer 124 covers a lower portion of opposed ends 106 (FIG. 10X) and covers liner 120 along the lower portion of opposed longitudinal sides 104 of active region 102. Liner 120 remains between fill layer 124 and the lower portion of opposed longitudinal sides 104 of active region 102, e.g., to apply the desired stress where it is a stress-inducing liner. As also shown in FIGS. 10Y and 10X, recessing fill layer 124 also removes protective liner 122 from the upper portion of active region 102, i.e., on opposed ends 106 and longitudinal sides 104. Consequently, in STI structure 100, protective liner 122 (if provided) is positioned between fill layer 124 and active region 102 along the lower portion of opposed ends 106 and between liner 120 and active region 102 along the lower portion of opposed longitudinal sides 104 of active region 102. It is removed from the upper portion of active region 102.

Figures 11X, 11Y:
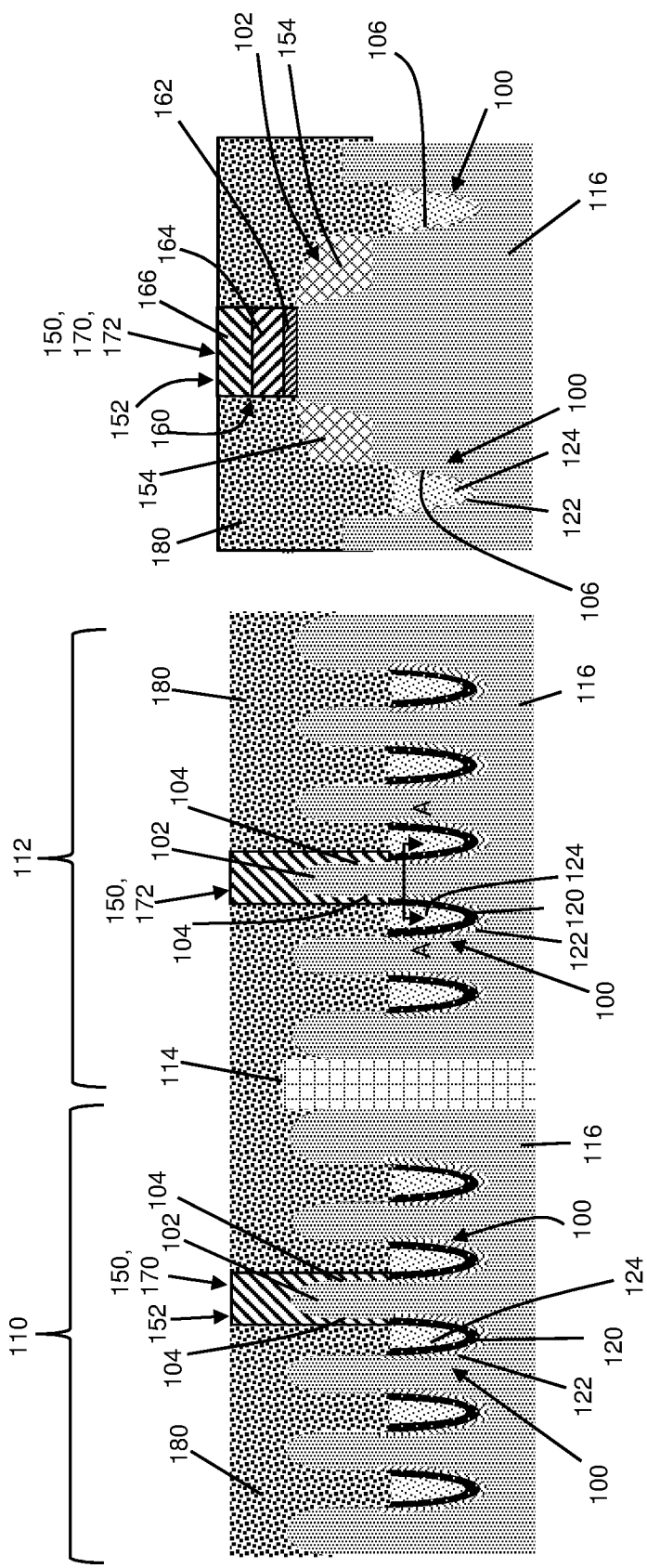
FIGS. 11Y and 11X show cross-sectional views of forming a FET including the STI structure, and also show a transistor and an STI structure, all according to embodiments of the disclosure.

As shown in FIGS. 11Y and 11X, subsequent processes may include forming a FET(s) 150. These processes may include any now known or later developed techniques to form a source/drain region 154 in active region 102, and a gate 152 extending over active region 102, e.g., a semiconductor fin. Source/drain region 154 may be formed, e.g., by implanting dopants in active region 102 and/or performing epitaxy to create raised/source drain regions in a known fashion. Gate 152 may also be formed using any known techniques. For example gate 152 may be formed by depositing and patterning gate materials. In another embodiment, a replacement metal gate (RMG) process may be carried out to create a metal gate, e.g., by forming dummy gates, forming source/drain regions among other structures, and replacing the dummy gate with a metal gate. In either case, as shown in FIG. 11X, gate 152 may include a gate region 160 formed on a gate dielectric 162. Gate regions 160 may include one or more conductive components for providing a gate terminal of a transistor. Metal gates 152 may include a high dielectric constant (high-K) layer 162, a work function metal layer 164 and a gate conductor 166. High-K layer 162 may include any now known or later developed high-K material typically used for metal gates 152 such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Work function metal layer 164 may include various metals depending on whether for an n-FET or p-FET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Gate conductor 166 may include any now known or later developed gate conductor such as copper (Cu). A gate cap (not shown) of, for example, a nitride may also be formed over gate region 160.

STI structure 100 in FET(s) 150 including liner 120 may be advantageous to both n-type FETs and p-type FETs. Where liner 120 imparts a stress, it may be especially advantageous to improve the performance of both n-type FETs and p-type FETs. FET 150 may include one of: an n-type FET 170 located in n-type region 110 of substrate 116, a p-type FET 172 located in p-type region 112 of substrate 116, or an n-type FET 170 located in n-type region 110 of substrate 116 and a p-type FET 172 located in a p-type region 112 of substrate 116. As noted, isolation trench 114 electrically isolates n-type region 110 and p-type region 112 from one another.

Any now known or later developed interlayer dielectric (ILD) 180 may be formed thereafter and contacts (not shown) to various structures formed. Example ILDs may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 12:
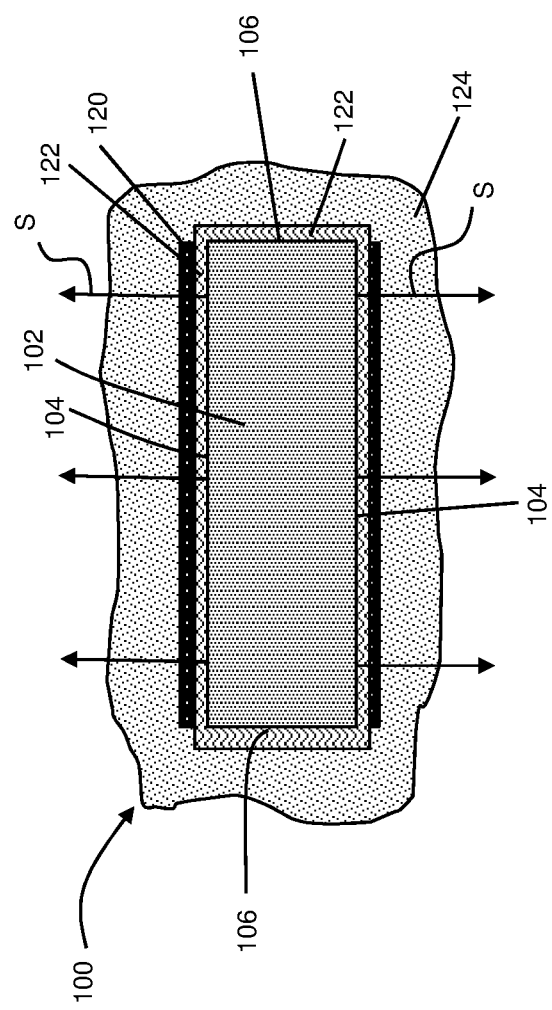
FIG. 12 shows a top down view of an STI structure on an active region along line A-A in FIG. 11Y according to embodiments of the disclosure.

As shown in FIGS. 11Y and 11X, STI structure 100 includes liner 120 and fill layer 124 liner 120 along the lower portion of opposed longitudinal sides 104 of active region 102, and fill layer 124 along opposed ends 106 of active region 102. That is, liner 120 and fill layer 124 on liner 120 extend along a bottom part of opposed longitudinal sides 104 of active region 102, but not over opposed ends 106. To further illustrate, FIG. 12 shows a top down view of STI structure 100 on active region 102 along line A-A in FIG. 11Y. Where it includes a stress, liner 120 imparts a transverse-to-length stress (arrows S, FIGS. 10Y and 12) in at least a lower portion of active region 102. In embodiments of the disclosure, liner 120 includes a tensile stress-inducing liner that imparts a transverse-to-length tensile stress in at least a lower portion of active region 102. The transverse-to-length tensile stress has been found to improve performance in n-FETs 170 and p-FETs 172. Since a lengthwise tensile stress is disadvantageous to certain FETs, e.g., p-FETs 172, liner 120 is not applied to opposed ends 106 of active region 102.

FIGS. 11Y and 11X also show FET 150 including STI structure 100. More particularly, each FET 150 may include active region 102 extending from substrate 116, the active region having a rectangular cross-sectional shape (see e.g., FIG. 12) including opposed longitudinal sides 104 and shorter opposed ends 106. FET 150 also includes gate 152 extending over active region 102, and source/drain region 154 in active region 102. FET 150 may also include protective liner 122. Protective liner 122 may be positioned between fill layer 124 and active region 102 along the lower portion of opposed ends 106 of active region 102 and between liner 120 and active region 102 along the lower portion of opposed longitudinal sides 104 of active region 102. As noted, FET 150 may include: an n-type FET 170 (e.g., an n-finFET) located in n-type region 110 of substrate 116, a p-type FET 172 (e.g., a p-finFET) located in p-type region 112 of substrate 116, or an n-type FET 170 located in n-type region 110 of substrate 116 and a p-type FET 172 located in a p-type region 112 of substrate 116. As noted, isolation trench 114 electrically isolates n-type region 110 and p-type region 112 from one another.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a transistor including:
   an active region over a substrate, the active region having a rectangular cross-sectional shape including a lower portion of the active region, an upper portion of the active region, opposed longitudinal sides and shorter opposed ends;
   a gate extending over the active region;
   a source/drain region in the active region; and
   a shallow trench isolation (STI) structure around the lower portion but not around the upper portion of the active region, the STI structure including: a first liner and a fill layer on the first liner along the opposed longitudinal sides of the active region, and the fill layer along the opposed ends of the active region the fill layer along the opposed ends of the active region,
   a second liner between the fill layer and the active region along the opposed ends of the active region and between the first liner and the active region on the opposed longitudinal sides of the active region,
   wherein the first liner has a first thickness of between approximately 2 and approximately 5 nanometers (nm) between the second liner and the fill layer on the opposed longitudinal sides of the active region,
   wherein the second liner has a second thickness of between approximately 20 and approximately 30 nm between the fill layer and the active region on the opposed ends of the active region and between the first liner and the active region on the opposed longitudinal sides of the active region, the second thickness.

2. The structure of claim 1, wherein the first liner imparts a transverse-to-length tensile stress in at least the lower portion of the active region.

3. The structure of claim 1, wherein the first liner includes silicon nitride, and the fill layer includes an oxide.

4. The structure of claim 1, wherein the transistor includes one of: an n-type FET located in an n-type region of the substrate, and a p-type FET located in a p-type region of the substrate.

5. The structure of claim 1, wherein the transistor includes: an n-type FET located in an n-type region of the substrate and a p-type FET located in a p-type region of the substrate, and
   further comprising an isolation trench electrically isolating the n-type region and the p-type region from one another.

6. The structure of claim 1, wherein the first liner extends solely along the opposed longitudinal sides of the active region, and not along the opposed ends of the active region.

7. A shallow trench isolation (STI) structure for an active region, the active region having a rectangular cross-sectional shape including a lower portion of the active region, an upper portion of the active region, opposed longitudinal sides and shorter opposed ends, the STI structure comprising:
   a first liner with a first vertical thickness of between approximately 2 and approximately 5 nanometers (nm) and a fill layer on the first liner along the opposed longitudinal sides of the lower portion of the active region, and the fill layer without the first liner along the opposed ends of the active region.

8. The STI structure of claim 7, further comprising a second liner, the second liner between the fill layer and the active region along the opposed ends of the active region and between the first liner and the active region along the opposed longitudinal sides of the active region.

9. The STI structure of claim 7, wherein the first liner imparts a transverse-to-length tensile stress in at least the lower portion of the active region.

10. The STI structure of claim 7, wherein the first liner extends solely along the opposed longitudinal sides of the active region, and not along the opposed ends of the active region.

11. The STI structure of claim 7, wherein the first liner includes silicon nitride, and the fill layer includes an oxide.

12. The STI structure of claim 8, wherein the second liner has a second vertical thickness of between approximately 20 and approximately 30 nanometers (nm).

13. The STI structure of claim 8, wherein the second liner includes polysilicon.

14. A method, comprising:
   providing an active region extending from a substrate, the active region having a rectangular horizontal cross-sectional shape including a lower portion of the active region, an upper portion of the active region, opposed longitudinal sides and shorter opposed ends; and
   forming a shallow trench isolation (STI) structure around the lower portion of the active region, the STI structure including: a first liner and a fill layer on the first liner along the opposed longitudinal sides of the active region, and the fill layer along the opposed ends of the active region,
   wherein the forming the STI structure includes: forming the first liner around the lower portion of opposed longitudinal sides of the active region, wherein the opposed ends of the active region are devoid of the first liner, and forming the fill layer adjacent the active region, the fill layer extending on the opposed ends and the opposed longitudinal sides, the first liner being between the fill layer and the lower portion of the opposed longitudinal sides of the active region,
   wherein the forming the first liner along the lower portion of the opposed longitudinal sides of the active region includes forming the first liner solely on the lower portion of the opposed longitudinal sides without forming the first liner on the opposed ends of the active region.

15. The method of claim 14, wherein the forming the STI structure includes:
   forming an organic dielectric layer over the first liner;
   patterning a photoresist layer that exposes the opposed ends of the active region;
   etching the organic dielectric electric layer along the opposed ends of the active region; and
   recessing the organic dielectric layer, leaving the organic dielectric layer covering the lower portion the semiconductor layer.

16. The method of claim 15, wherein the recessing the organic dielectric layer includes:
   etching such that the active region is devoid of the organic dielectric layer; and
   etching such that the upper portion of the opposed longitudinal sides of the active region is devoid of the organic dielectric layer.

17. The method of claim 16, wherein the forming the fill layer adjacent the active region includes:
   depositing the fill layer, the fill layer covering the first liner; and
   recessing the fill layer, the fill layer covering a lower portion of the opposed ends and covering the first liner along the lower portion of the opposed longitudinal sides.

18. The method of claim 17, further comprising, prior to forming the first liner, forming a second liner over the active region,
   wherein the recessing the fill layer includes leaving the second liner devoid of the fill layer along the upper portion of the active region, wherein the second liner is positioned between the fill layer and the active region along the lower portion of the opposed ends of the active region and between the first liner and the active region along the lower portion of the opposed longitudinal sides of the active region.

19. The method of claim 14, wherein the first liner includes a tensile stress-inducing liner that imparts a transverse-to-length tensile stress in at least the lower portion of the active region.

20. The method of claim 14, wherein the first liner extends solely along the opposed longitudinal sides of the active region, and not along the opposed ends of the active region.

* * * * *